(12) United States Patent
Shimada

(10) Patent No.: US 7,077,913 B2
(45) Date of Patent: Jul. 18, 2006

(54) APPARATUS FOR FABRICATING A SEMICONDUCTOR DEVICE

(75) Inventor: Tomoharu Shimada, Tokyo (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 133 days.

(21) Appl. No.: 10/345,190

(22) Filed: Jan. 16, 2003

(65) Prior Publication Data

US 2003/0150386 A1  Aug. 14, 2003

(30) Foreign Application Priority Data

Jan. 17, 2002  (JP)  ............................. 2002-008923

(51) Int. Cl.
*H01L 21/00* (2006.01)
*C23C 16/00* (2006.01)

(52) U.S. Cl. ........................ 118/725; 118/728; 118/724; 156/345.51; 156/345.52; 206/832; 219/444.1; 219/544

(58) Field of Classification Search ................ 118/725, 118/728, 724; 156/345.51, 345.52, 345.53; 206/832; 219/444.1, 544

See application file for complete search history.

(56) References Cited

U.S. PATENT DOCUMENTS

| | | | | |
|---|---|---|---|---|
| 5,275,521 A | * | 1/1994 | Wada | ........................ 414/404 |
| 6,062,853 A | | 5/2000 | Shimazu et al. | ............. 432/258 |
| 6,099,302 A | * | 8/2000 | Hong et al. | ................... 432/259 |
| 6,576,064 B1 | * | 6/2003 | Griffiths et al. | .............. 118/728 |
| 2001/0001953 A1 | * | 5/2001 | Griffiths et al. | .............. 118/728 |

FOREIGN PATENT DOCUMENTS

| | | | |
|---|---|---|---|
| JP | 62-066527 | | 4/1987 |
| JP | 4133417 | | 5/1992 |
| JP | 6163440 | | 6/1994 |
| JP | 9237781 | | 9/1997 |
| JP | 9251961 | | 9/1997 |
| JP | 10050626 | | 2/1998 |
| JP | 10321543 A | * | 12/1998 |
| JP | 11-40509 | | 2/1999 |
| JP | WO 00019502 A1 | * | 4/2000 |

* cited by examiner

*Primary Examiner*—Ram N Kackar
(74) *Attorney, Agent, or Firm*—Bacon & Thomas, PLLC

(57) ABSTRACT

A semiconductor fabricating apparatus having a structure, which facilitates a loading and unloading operation of wafers while having a low effect by a high temperature during a heat treatment. The semiconductor fabricating apparatus includes a plurality of ring-shaped holder having brims and recessed portions, the brims for mounting the to-be-processed wafers thereon, thereby performing the required heat treatment. A tweezer plate of a wafer loading-transferring device is inserted onto the recessed portion or taken out therefrom, and the inserted tweezer plate is ascended or descended, so that the wafer can be inserted on the brims or taken out therefrom.

9 Claims, 11 Drawing Sheets

APPARATUS FOR FABRICATING A SEMICONDUCTOR DEVICE

FIELD OF THE INVENTION

The present invention relates to an apparatus for fabricating a semiconductor device; and, more particularly, to an apparatus capable of efficiently performing various heat treatments and facilitating transferring of a wafer onto/from a holder, while preventing slip and generation of impurities and scratches on the wafer.

BACKGROUND OF THE INVENTION

In fabricating semiconductor devices, various heat treatments such as an oxidation treatment, a diffusion process, a chemical vapor deposition (CVD) process or the like are performed. A vertical type heat treatment apparatus having a boat with a plurality of wafers vertically stacked therein is used in performing such heat treatments.

The wafers are first vertically stacked at a predetermined interval inside the boat, and the boat is then loaded into a reaction chamber. Thereafter, the vertically stacked wafers are heat-treated using a heating unit while supplying into the reaction chamber gas chosen depending on the nature of the heat treatment.

Conventionally, a boat used in such vertical type heat treatment apparatus includes, as shown in FIG. 7, a top plate 10, a bottom plate 11 and three supporting bars 12, wherein the three supporting bars 12 are supported by the top and the bottom plates 10 and 11. A plurality of grooves 13 are formed in each of the three supporting bars 12, so that a plurality of wafers 4 can be vertically stacked and maintained therein. Referring to FIG. 7, only the grooves 13 formed in top and bottom portions of the supporting bars 12 are illustrated and grooves in remaining portions thereof are omitted for simplicity.

Further, Japanese Patent Laid-Open Publication No. 1997-251961 discloses two types of wafer loading methods: one employing either inclined or curved grooves into which the wafer is directly inserted and the other employing a ring-shaped (annular) susceptor onto which the wafer is placed. Similarly disclosed in Japanese Patent Laid-Open Publication Nos. 1994-163440 and 1998-50626 are boats using ring-shaped holders.

Direct placing of wafers in the grooves formed in the supporting bars of the boat, as described in FIG. 8, provides minimal surface contact therebetween (three contact points in case of FIG. 8). Such minimal surface contact generates augmented deformation (due to the weight of the wafer itself) and thermal stresses in the wafers, producing defects, e.g., slip, therein.

Further, if the grooves have sharp edges contacting the heated wafers, such local contacts can easily produce scratches on the wafers softened by heat.

Moreover, the situation can be further aggravated by large surface roughness of the grooves if exist, which further produces scratches thereon. Even in the case where the grooves are provided with inclined or curved edges, such still cannot prevent the slip generation in the wafers, due to its inherent nature of minimized local contacts having small contact areas.

Regarding the prior art holders or susceptors supra, the prior art references lack in their detailed usage and operation, e.g., wafer loading and unloading processes. Therefore, elaborate wafer holders need be devised for their practical implementation in the field of semiconductor fabrication.

SUMMARY OF THE INVENTION

It is, therefore, a primary object of the present invention to provide an apparatus for fabricating a semiconductor device capable of efficiently performing a heat treatment process at high temperature (at or above 800° C.), without slip generation in wafers and the occurrence of impurities and scratches thereon.

Another object of the present invention is to provide an apparatus for fabricating a semiconductor device capable of expediting and facilitating loading and unloading operation of wafers onto and from a ring-shaped holder.

In accordance with an embodiment of the invention, there is provided an apparatus for fabricating a semiconductor device, including: a substrate processing chamber; and one or more substantially ring shaped holders, each holder including at least one major portion for supporting a circumference of a substrate when the substrate is mounted on the holder, and at least one recessed portion for interconnecting end parts of the major portion, wherein the recessed portion has a height difference with the major portion of the holder and the substrate is processed in the substrate processing chamber while the substrate is mounted on the holder.

In the present invention, a ring-shaped holder for mounting a wafer thereon is inserted and maintained in the grooves formed in the supporting bars of a boat. Thus, such holder provides greater contact area compared to the conventional method of directly loading the wafers into the grooves. Naturally, the adverse effects of using the conventional method of direct loading are effectively eliminated.

In other words, during the heat treatment process performed at varying temperatures throughout the process, the wafer experiences deformations due to, e.g., temperature variations during wafer temperature ramping up and down processes and a high heat treatment temperature; and in the conventional method of loading, such phenomenon is the primary cause of the adverse effects. However, the ring-shape holder of the present invention, which offers greater contact area with the wafer, provides a greater uniform support for the wafer, thereby effectively reducing or eliminating the generation of slip in the wafer, regardless of the deformations or thermal contractions/expansion thereof.

Moreover, the ring-shape holder absorbing heat from a heater reduces temperature gradient on a surface of the wafer, thereby enhancing uniformity in temperature. In particular, it is preferable to have the outer diameter of the ring-shape holder greater than that of the wafer.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Hereinafter, a first preferred embodiment of the present invention will be described with reference to the accompanying drawings of FIGS. 1 to 3D.

Figure 3A:
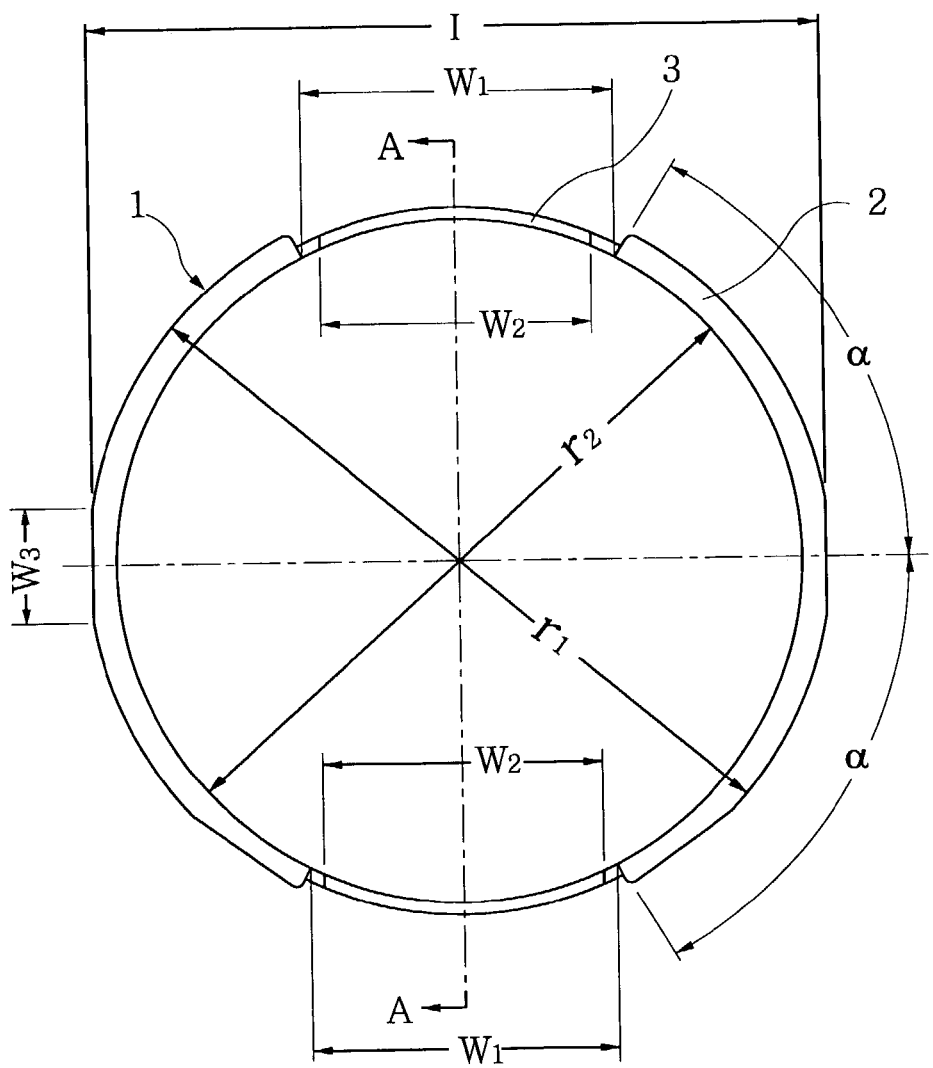
FIGS. 3A to 3D illustrate various views setting forth the structure of the ring-shaped holder in accordance with the first preferred embodiment of the present invention.
Figure 3B:
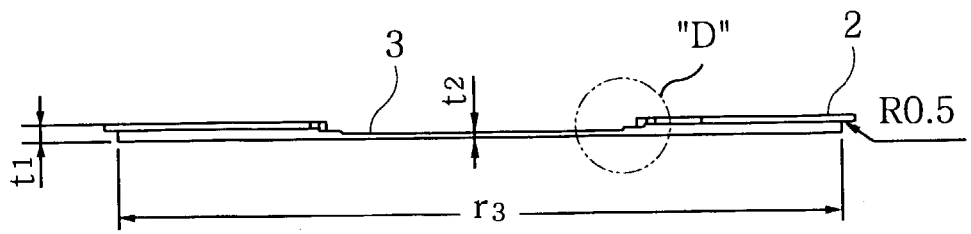
Figure 3C:
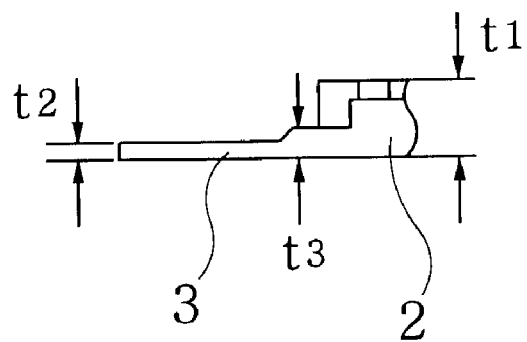
Figure 3D:
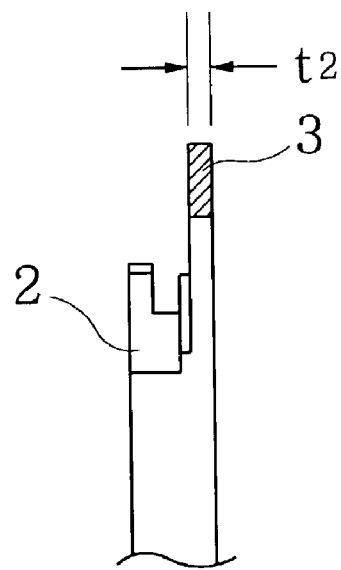

FIG. 3A shows a plan view of a holder 1 in accordance with the first preferred embodiment of the present invention; FIG. 3B describes a front view of the holder 1 of FIG. 3A; FIG. 3C illustrates an enlarged view of a portion "D" shown in FIG. 3B; and FIG. 3D presents a partial cross sectional view of the holder taken along the line A—A shown in FIG. 3A.

Figure 1A:
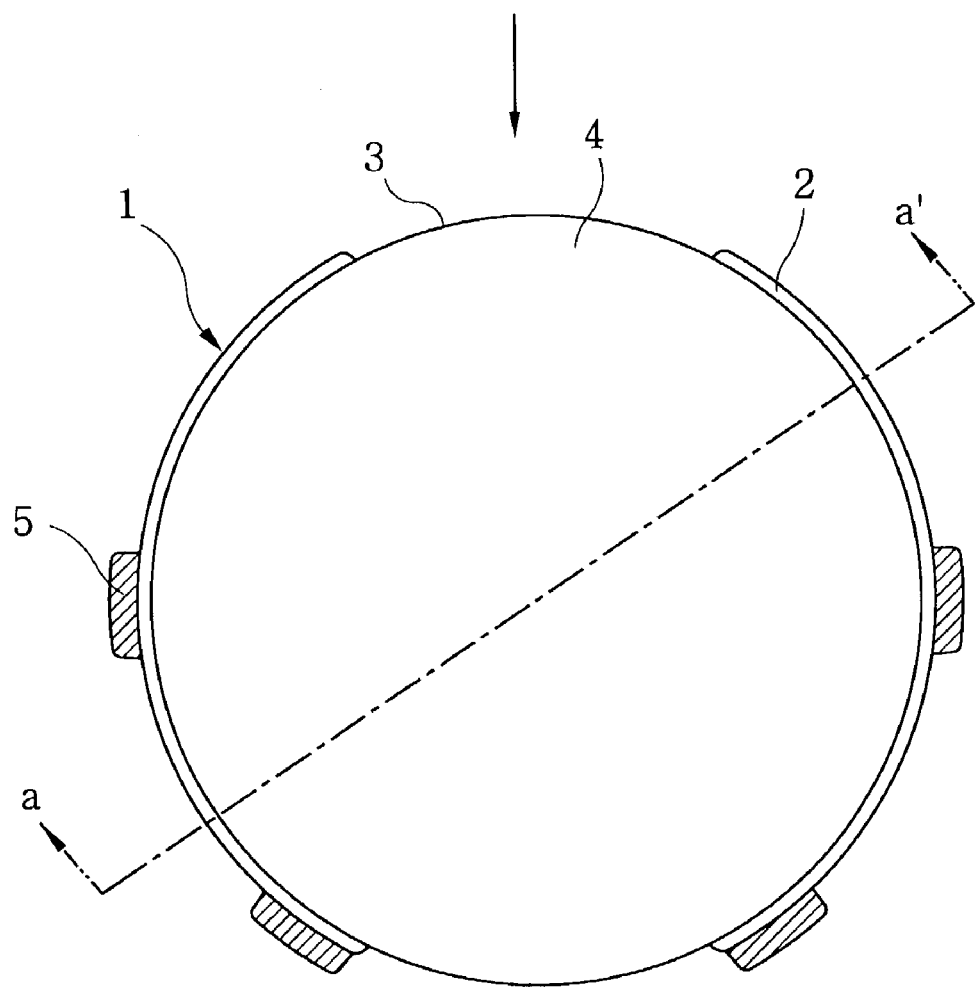
FIGS. 1A and 1B show a plan and a front view of a ring-shaped holder in accordance with a first preferred embodiment of the present invention, respectively.
Figure 4A:
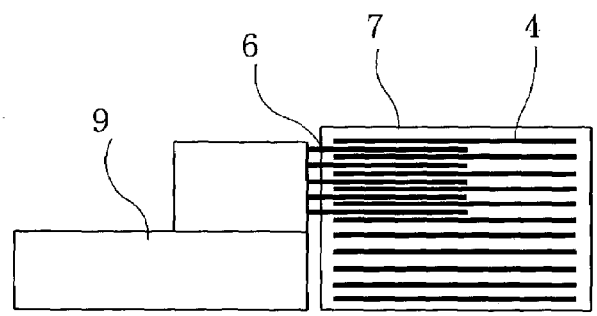
FIGS. 4A and 4B offer a wafer transferring sequence from a cassette into a boat in accordance with the present invention.
Figure 4B:
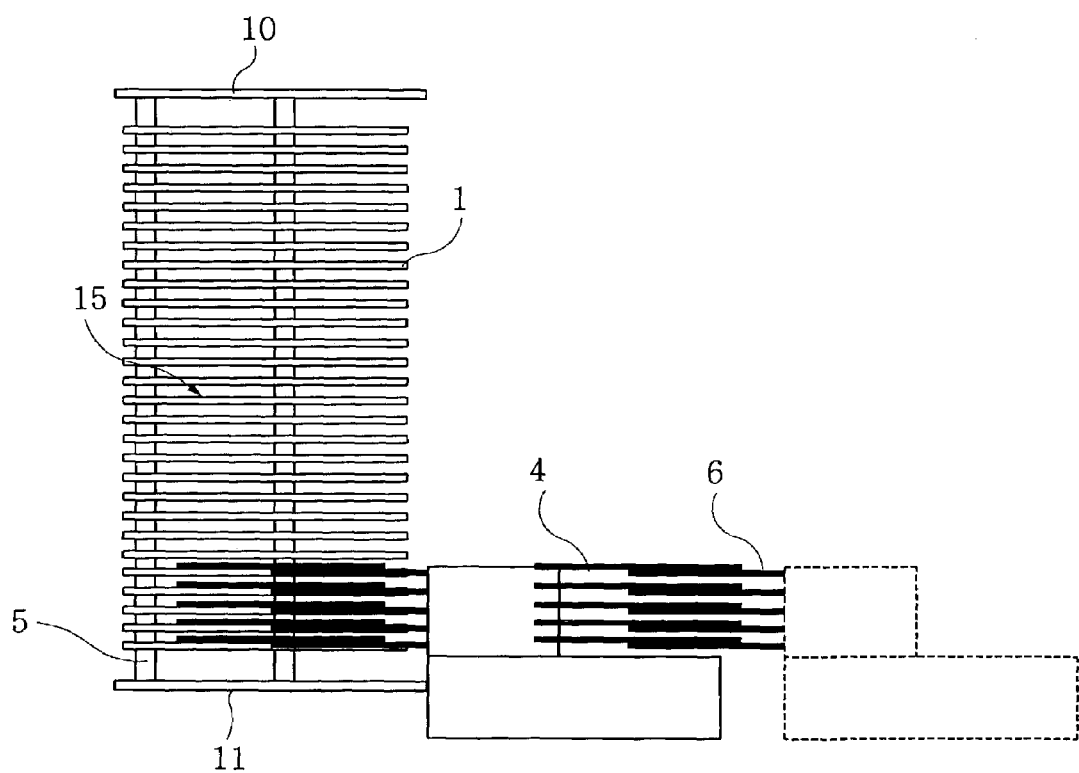
Figure 5:
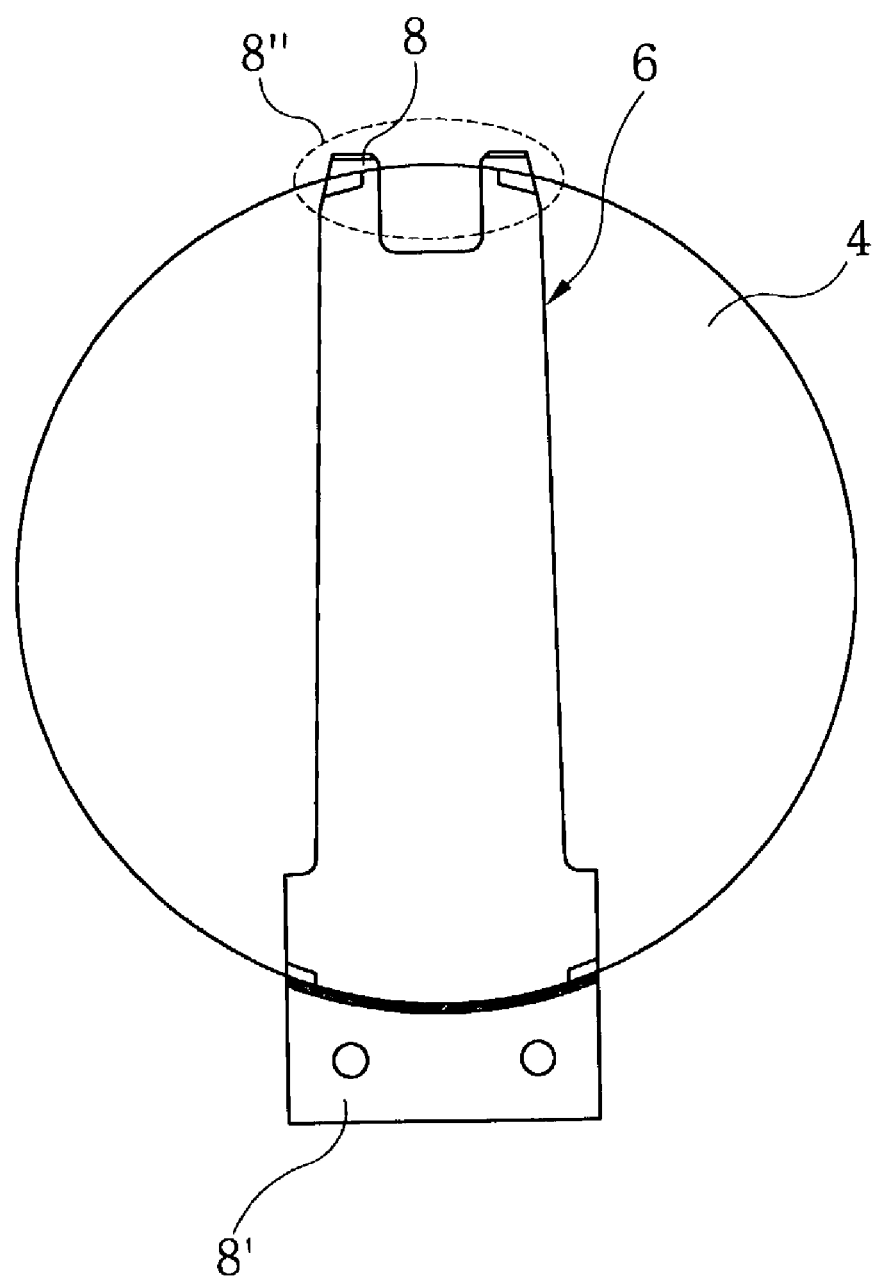
FIG. 5 provides a tweezer plate in accordance with the first preferred embodiment of the present invention.

As shown in FIG. 3A, the holder 1 for mounting a wafer or substrate 4 thereon and formed in a shape of ring includes brims (thicker portions) 2 and recessed portions (thinner portions) 3 having upper surfaces lower than those of the brims 2. The holder 1 has a generally flat bottom surface. The ring-shaped holder 1, as shown in FIG. 1A, is inserted into grooves formed in the boat supporting bars 5 provided in a boat to be supported thereby. A wafer 4 to be processed is disposed on the brims 2. Each of the recessed portions 3 has a width larger than that of an inserting portion of a tweezer plate 6 (as shown in FIGS. 4A to 5) and a depth deep enough for the tweezer plate 6 to be lowered and extracted from the holder 1 after placing the wafer thereon, so that the wafer 4 can be loaded on and unloaded from the brims 2 by using the tweezer plate 6.

In other words, in case of placing a wafer onto the holder 1, the tweezer plate 6 having an unprocessed wafer placed thereon is transferred in the direction of the arrow shown in FIG. 1A. Specifically, the unprocessed wafer is transferred over the brims 2, while the inserting portion of the tweezer plate 6 passes through the recessed portions 3 until the wafer 4 is concentrically aligned with the holder 1. Then, the tweezer plate 6 having the unprocessed wafer 4 placed thereon is lowered while maintaining its alignment with respect to the holder 1. Consequently, the wafer 4 is mounted on the brims 2 of the holder 1 and the tweezer plate 6 is lowered further as to be disengaged from the wafer. The disengaged tweezer plate 6 is then transferred in the reverse direction of the arrow mentioned above until the tweezer plate 6 is completely disengaged from the holder.

In a similar manner, a wafer 4 placed on the brims 2 of the holder 1 can be retrieved by first transferring the tweezer plate 6 in the direction of the arrow until it is completely aligned with the wafer 4, at which time it is raised. Consequently, the tweezer plate 6 engages in a contact with the wafer 4 and further raises the wafer above the brims 2, at which time the tweezer plate 6 is transferred in the reverse direction of the arrow, through the recessed portions 3.

Therefore, such configuration of the ring-shaped holder 1, having the brims 2 for loading the wafer 4 thereon and the recessed portion 3 enabling the tweezer plate 6 to pass therethrough, facilitates and expedites loading, and unloading operation of the wafer 4.

Figure 1B:
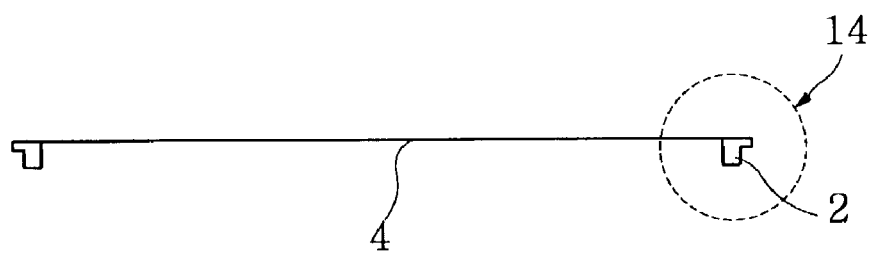
Figure 2A:
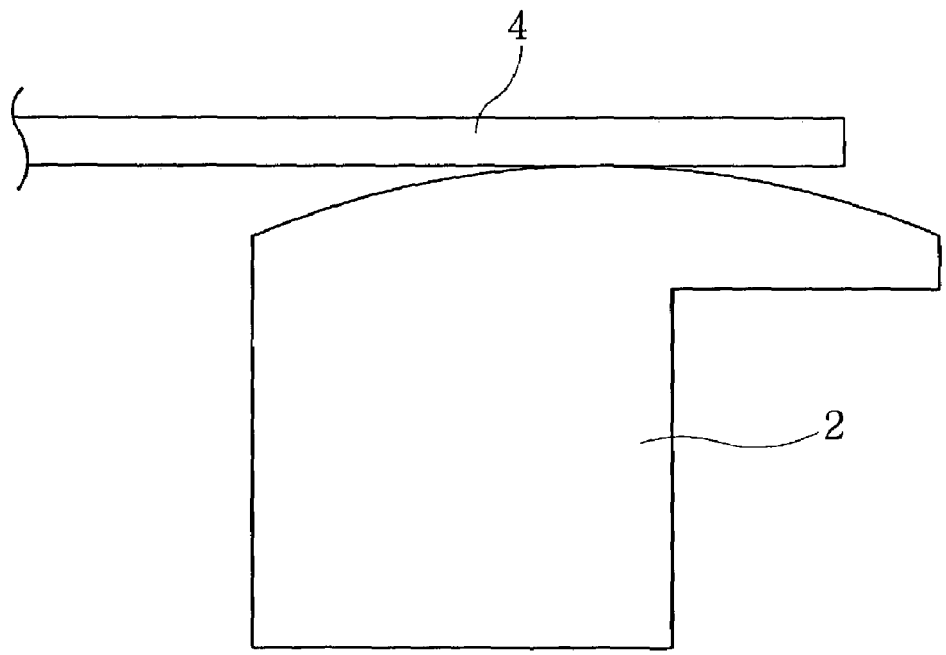
FIGS. 2A and 2B describe partially enlarged views of an end portion of FIG. 1B, respectively.
Figure 2B:
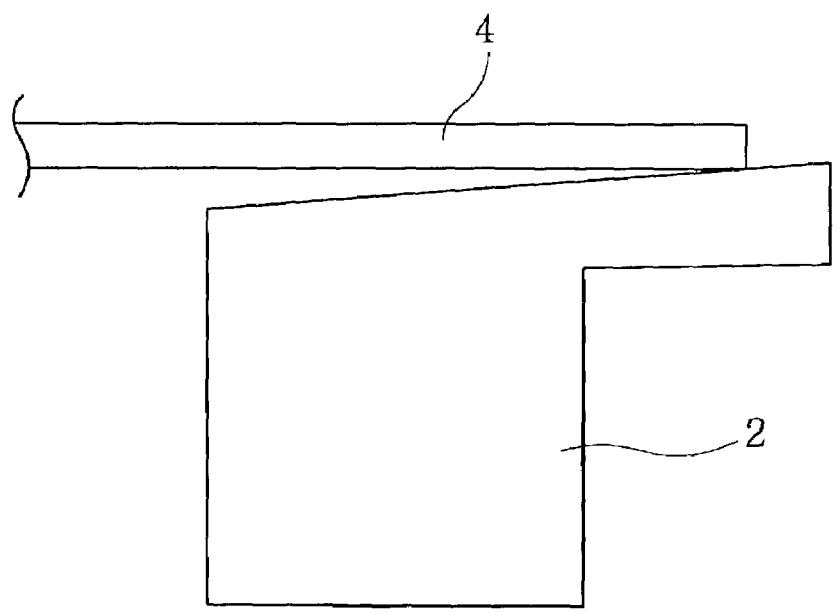

FIGS. 2A and 2B describe exemplary enlarged partial views of an end portion 14 provided in FIG. 1B (FIG. 1B is a schematic cross sectional view taken along the line a–a' in FIG. 1A). As shown in FIGS. 2A and 2B, respective top contact surfaces of the brims 2 are tapered or curved toward the center of the wafer 4. Such configuration can effectively prevent a point or line contacts between the bottom of the wafer 4 and an edge portion of the holder 1 having a sharp angle. Therefore, the occurrence of scratches on bottom of the wafer 4 can be dramatically reduced.

Moreover, by reducing surface roughness of the holder 1, micro protrusions thereon are reduced and formation of scratches on the surface of the wafer 4 can be further prevented, reducing the generation of slip caused by the scratches on the wafer 4. A better result is expected from the holder 1 having a smaller surface roughness, but with about $1/5$ to $1/10$ of a conventional surface roughness, i.e., Ra (centerline mean roughness) of about 0.5 to 0.1 μm, satisfactory results can be achieved.

Figure 6:
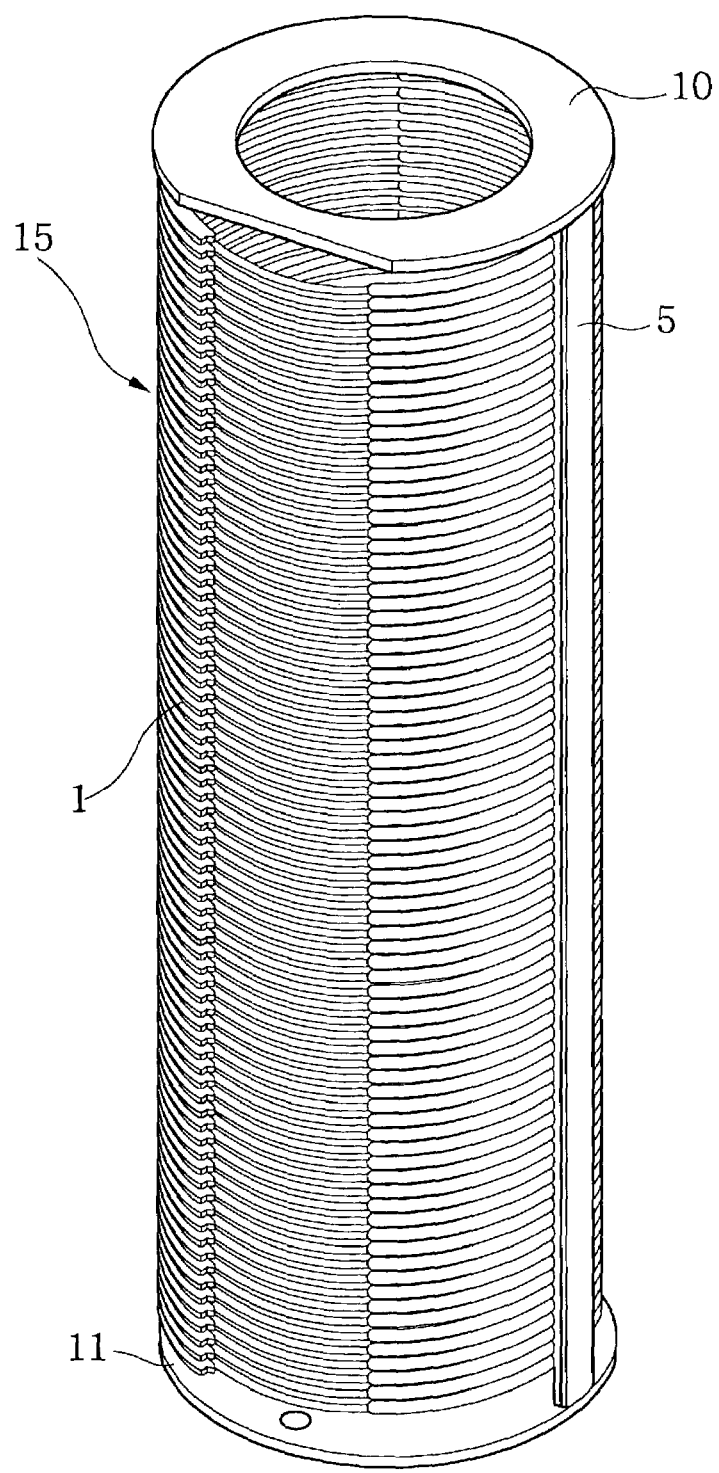
FIG. 6 presents an exemplary boat in accordance with the present invention.
Figure 7:
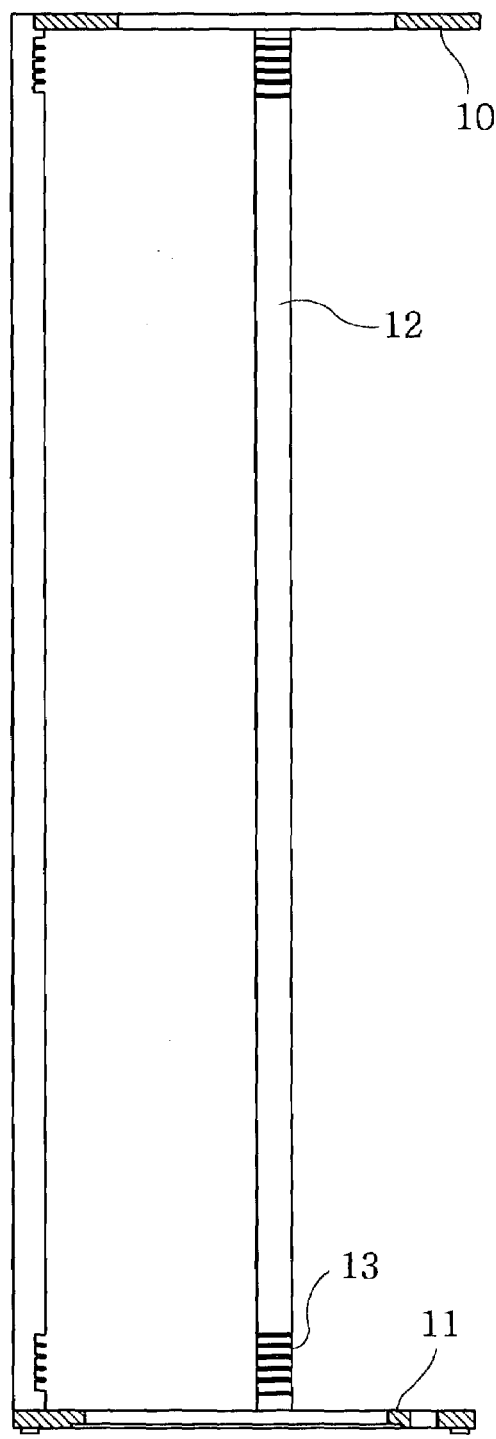
FIG. 7 represents a side view of a conventional boat.
Figure 8:
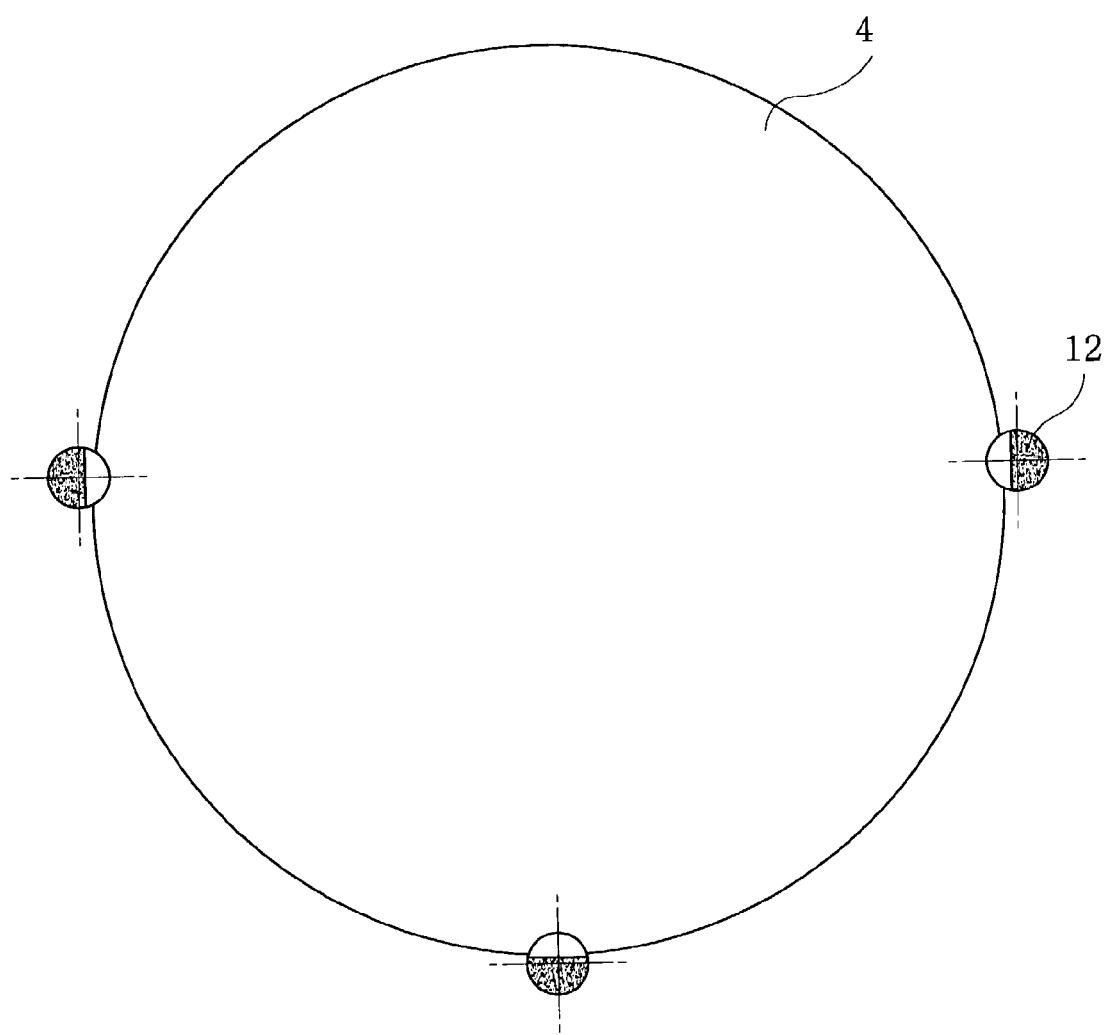
FIG. 8 presents a plan view of a conventional wafer supporting bars holding a wafer.

Further, the holder 1 and the supporting bars 5 shown in FIG. 6 are made of SiC, and are arranged so that the holder 1 can be inserted or removed into or from grooves formed in the supporting bars 5 of the boat 15. The holder 1 and the supporting bars 5, however, can also be formed of single crystalline silicon or polycrystalline silicon. The simple single structure of the ring-shaped holder 1 of the present invention including the brims 2 and the recessed portions 3 as described in FIGS. 1A and 1B, can be readily manufactured using SiC, single crystalline silicon, or polycrystalline silicon.

Since SiC, single crystalline silicon, and polycrystalline silicon have high thermal resistance and chemical resistance, and retain its shape and form even at a temperature ranging from about 1200 to 1300° C., they are preferred as a material of the holder 1, supporting bars 5 and the boat 15. Though their lack of weldability makes them less desirable in fabricating complex shapes and designs, the simple structure of the ring-shaped holder 1 used in the preferred embodiment allows the holder 1 to be formed of SiC, single crystalline silicon, or polycrystalline silicon, facilitating the insertion of a plurality of holders 1 into the grooves formed in the supporting bars 5 and maintaining the holders 1 therein, as shown in FIG. 6. In comparison, of the materials mentioned above, SiC has better thermal resistance and chemical resistance than those of the others, and is substantially more stable against oxidation. Thus, SiC is preferred for use as the material of the holder 1 and the supporting bars 5 over the others.

There has been proposed a conventional holder for mounting a wafer thereon, which is divided into two, where one of the divided sections of the holder is welded onto the supporting bars and the other attached to the welded section after a wafer is placed thereon. However, since SiC has a very high melting point, it is difficult to precisely welded one of the sections of the holder at predetermined positions on the supporting bars. Therefore, SiC is not suitable material of the holder in such prior art scheme.

Alternative to welding may be employed in the above prior art holder, such as inserting the holder directly into the grooves. However, such method forces the holder divided into two to be easily disengaged therefrom. Moreover, such method precludes the holder from being symmetrically loaded into the grooves. In contrast, the brims 2 and the recessed portions 3 of the ring-shaped holder 1 in accordance with the preferred embodiment are formed as a single unit, enabling the holder to be stably maintained in the grooves formed in the supporting bars 5.

In contrast to the conventional art, the wafer 4 of the present invention is placed on the long arc-shaped brims 2. Therefore, area of contact between the holder 1 and the wafer 4 becomes much larger, and the thermal and deformation (due to the weight of the wafer itself) stresses are effectively distributed in the wafers, thereby greatly reducing the generation of slip.

Further, the ring-shaped holder 1 of the present invention includes the recessed portions 3 functioning as a passageway for the tweezer plate 6, thereby facilitating transfer of the wafer 4 onto and from the holder 1 as mentioned above.

In accordance with the preferred embodiment, a ring-shaped holder 1 having a size defined in the following is employed as a holder 1, although other holders having various shapes and sizes can be used. That is, as shown in FIG. 3A, the outer and inner diameters $r_1$ and $r_2$ of the holder 1 are 308 mm and 280 mm, respectively. The two brims 2 are symmetrically disposed with respect to a vertical axis of the ring-shaped holder 1. More rigorously, the inventive holder 1 has a plane symmetry with regard to a plane passing through the center line A—A while normally bisecting the holder 1. An angle made by each of the brims 2 forming an angle with respect to the center point thereof is 126° (the horizontal axis bisects the angle, forming an angle α at 63°). Formed on the circumferential portions of the ring-shaped holder 1 are straightened portions, each having a length $W_3$ of 55.3 mm, that are in contact with the supporting bars 5 (4 such bars as in FIG. 1). Accordingly, the distance I between the straight portions disposed at two opposite sides of the holder 1 is 303 mm, which is smaller than the outer diameter $r_1$.

As shown in FIG. 3B, the distance $r_3$ between bottom portions of the straightened portions is 294 mm. The straightened portions of the ring-shaped holder 1 guarantees firm placement of the holder 1 into the supporting bars 5 of the boat. The holders 1 are engaged with the supporting bars 5, by means of inserting the holder 1 into the grooves 13 of the supporting bars 5, accordingly, the outer portions of the brims 2 are formed to be thin as shown in FIG. 2. Further, the inner diameter of the recessed portions 3 is 280 mm identical to that of the brims 2.

As shown in FIG. 3B, the thickness $t_1$ and $t_2$ of the brims 2 and the recessed portion 3 are 8 mm and 2 mm, respectively, yielding depth of the recessed portion 3 of about 6 mm. Further, as shown in FIG. 3C, the thickness $t_3$ of the recessed portion 3 adjoining the brims 2 is 3 mm.

A width $W_1$ of the recessed portion 3 having the thicknesses $t_2$ and $t_3$ is 127 mm. A width $W_2$ of a portion having the thickness $t_2$ of 2 mm is 120 mm, which functions as a passageway for the tweezer plate 6. Since the width and the thickness of the inserting portion of the tweezer plate 6 are at most about 105 mm and 2 mm, respectively, the tweezer plate 6 having such dimensions can be freely passed through the recessed portion 3 having a depth of 6 mm (with the thickness of 2 mm). Accordingly, placing the wafer 4 onto the brims 2 or retrieving therefrom is facilitated by the use of the tweezer plate 6.

Such holder 1 is made of SiC, and an additional SiC layer having a thickness of about 60 μm is deposited thereon by a CVD (chemical vapor deposition) method. Further, each portion of the ring-shaped holder 1 has a tolerance of surface flatness of about ±0.05 μm. Adjoining portions between the brims 2 of the holder 1 and the wafer 4 are designed so as to have the curved or inclined surface as shown in FIGS. 2A and 2B.

Figure 3E:
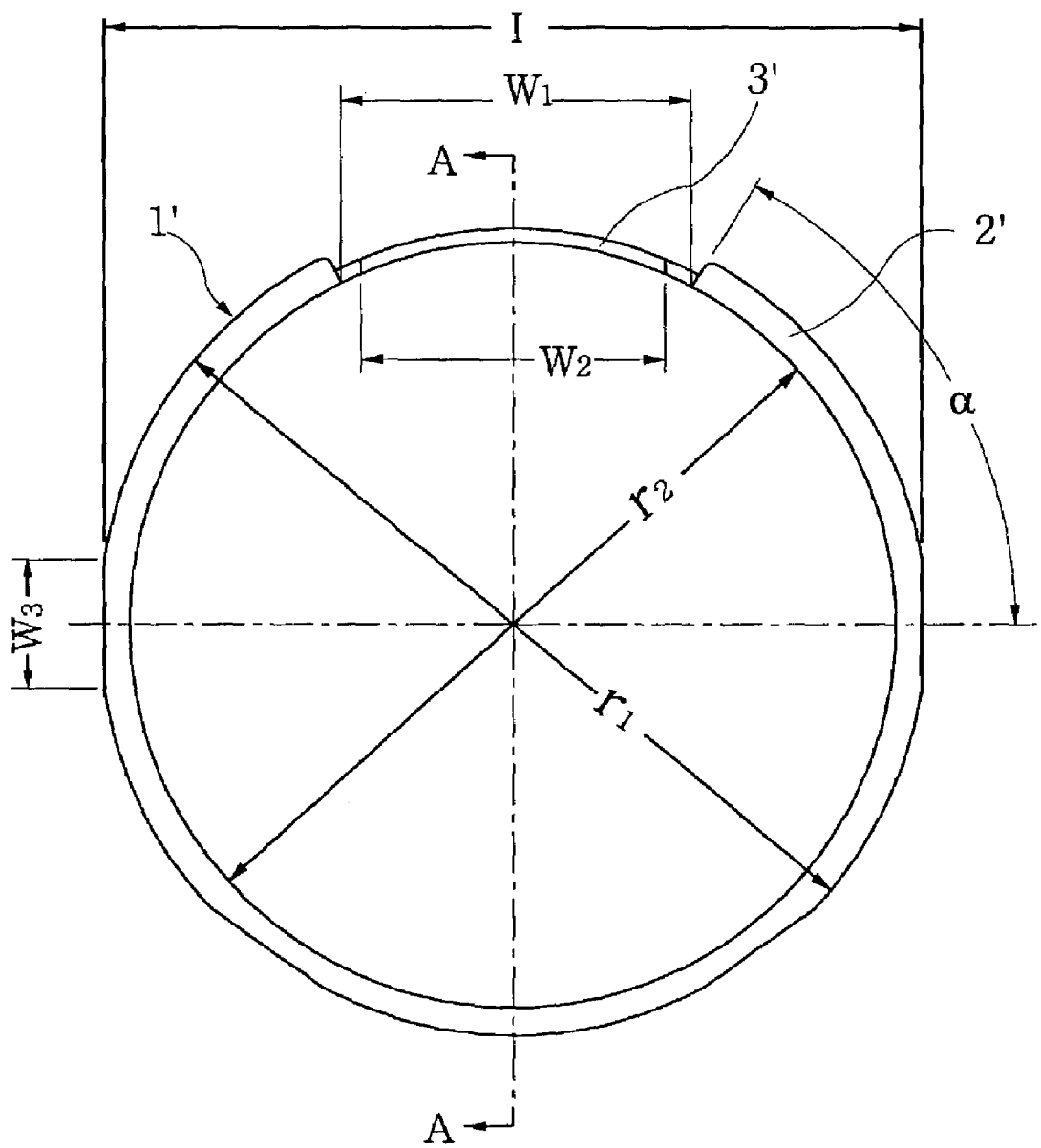
FIG. 3E is a plan view in accordance with a second preferred embodiment of the present invention.

In accordance with a second preferred embodiment, as illustrated in FIG. 3E, only a single recessed portion 3' and one brim 2' are formed in the holder 1', in which case an end portion 8" including guiding grips 8 at the tip of the tweezer plate 6 shown in FIG. 5 should be removed therefrom in order to enable the wafer 4 to properly mounted on the single continuous brim 2'.

Subsequently, such a mounting operation of the wafer on the holder 1 and the subsequent heat treatment process are described using FIGS. 4A, 4B and 9. First, as shown in FIG. 4A, each of a plurality of wafers 4 disposed in a cassette 7 are mounted on respective tweezer plates 6 of a wafer transferring device 9, and are then taken out from the cassette 7. Next, as shown in FIG. 4B, by first rotating the wafer transferring device 9, so that the wafers 4 face the ring-shaped holders 1 disposed in the boat 15, the rotated wafer transferring device 9 can now transfer the plurality of wafers 4 to above each of the ring-shaped holders 1 placed in the boat 15. Thereafter, the tweezer plates 6 are lowered, and places the wafers 4 on the brims 2 or 2' of the holder 1, respectively. Upon completion of placing the wafers 4 on the holders 1, the tweezer plates 6 are retracted, covering the same path as the original incoming path, thereby exiting and disengaging from the boat 15. By repeating such process, a desired number of wafers 4 are transferred from one or more cassettes 7 to the ring-shaped holder 1 disposed in the boat 15 and then a heat treatment process can be performed thereon.

Figure 9:
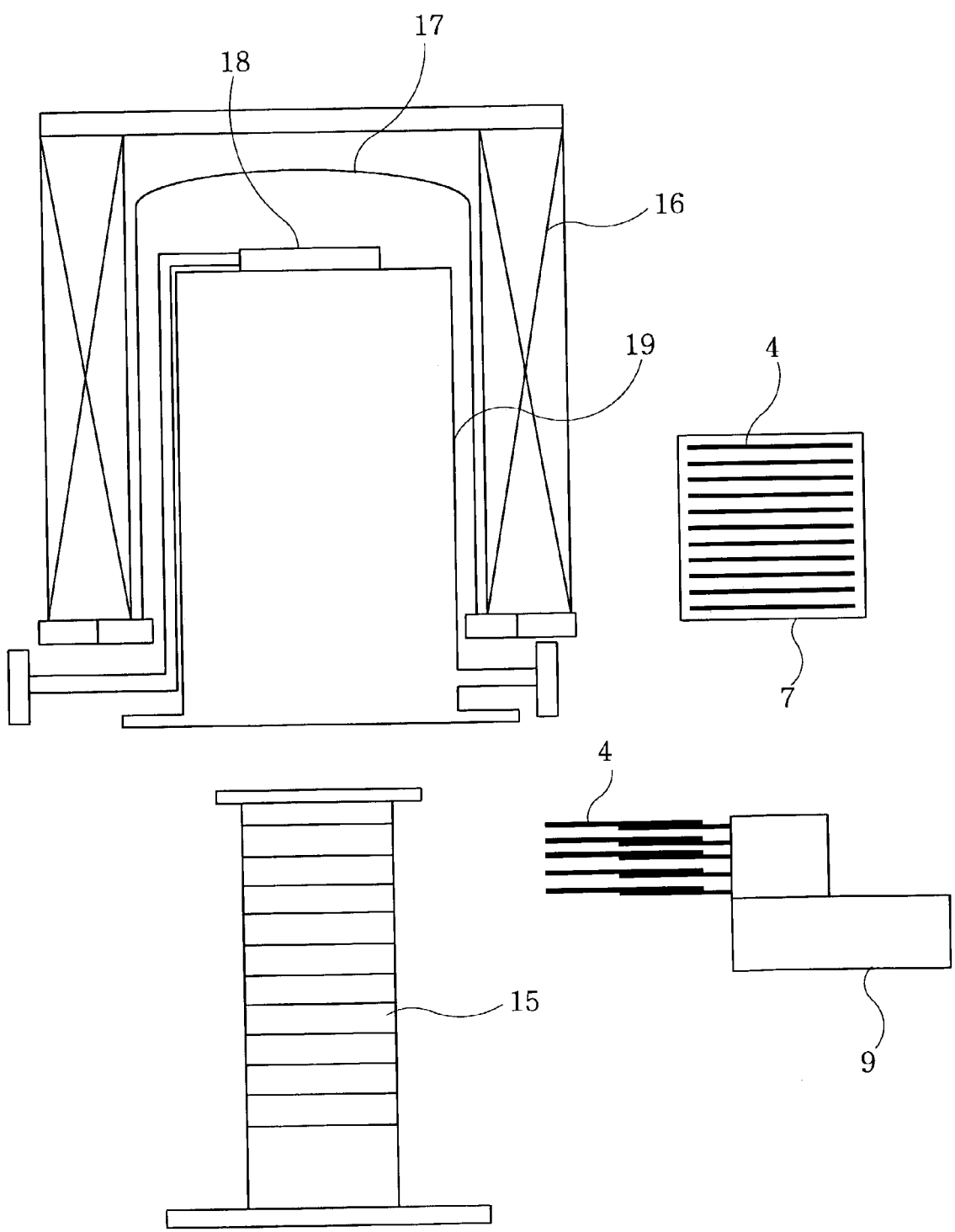
FIG. 9 depicts a heat treatment apparatus using the ring-shaped holders in accordance with the present invention.

After the wafers 4 are taken out from the cassettes 7 and are transferred into the boat 15 by the wafer transferring device 9, as shown in FIG. 9, the wafer containing boat 15 is loaded into a gas reaction chamber or substrate processing chamber 19 and the predetermined heat treatment is initiated. The reaction chamber 19 is arranged in a heat diffusing tube 17 for providing uniform temperature distribution in the reaction chamber 19, and heaters 16 are disposed outside the heat diffusing tube 17, to provide appropriate heating to the wafers 4 loaded in the reaction chamber 19. The reaction chamber 19 maintaining a predetermined gas atmosphere during the heat treatment process, has a gas supply inlet 18 for introducing gas thereinto.

After finishing the heat treatment, the boat 15 is taken out from the reaction chamber 19, and the wafers 4 are discharged from the holders 1, which are provided for subsequent processing. Needless to say, in transferring the wafers 4 from the holders 1 back into the cassette 7, the above mentioned sequence of loading may be carried out in a reverse order.

An exemplary tweezer plate 6 provided with the wafer transferring device 9 is described in FIG. 5. The tweezer plate 6, in accordance with the first preferred embodiment of the invention to be used for the holder 1 shown in FIG. 3A, has placement grips 8 and 8' for placing a wafer 4 therebetween. The placement grips 8 and 8' are configured to be higher than portions on which the wafer 4 is placed, and the wafer 4 is placed on a lower portion between the placement grips 8 and 8'. Further, as shown in FIG. 5, rims of the placement grip 8' is in an arc shape, thereby facilitating the placement of the wafer 4 on the lower portion between the placement grips 8 and 8' to ensure the loading on a predetermined position on the tweezer plate 6.

FIG. 6 describes an exemplary boat 15 in accordance with the present invention. A multiplicity of ring-shaped holders 1 or 1' are stacked on a multiplicity of grooves formed in the boat supporting bars 5. As described above, each of the wafers is placed on each of the holders 1 or 1'. Further, in FIG. 6, reference numerals 10 and 11 indicate the top and bottom plates for fixing the supporting bars 5 therebetween.

By using the ring-shaped holder in accordance with the present invention, the heat treatment can be carried out at about 800° C. with respect to the silicon wafers having a diameter of 30 cm without any hindrance.

In accordance with the present invention, a desired heat treatment is performed, while placing a wafer on arc-shaped brim(s) of a holder. Thus, when compared with a wafer that is directly supported on the grooves formed in the supporting bars, the thermal stress generated during the heat treatment process and the deformation due to the weight of the wafer itself are reduced, resulting in reduction of the generation of slip, and also the occurrence of the impurities and scratches due to the contact between the wafer and the holder is also reduced, thereby improving the throughput of product wafers.

The ring-shaped holder having one or two brims onto which the wafer is placed further includes one or two recessed portions where the tweezer plate of the wafer transferring device can be passed through, thereby facilitating the loading/unloading operation of the wafer.

Moreover, the simple configuration of the single bodied ring-shaped holder having the brim(s) and the recessed portion(s), can be readily manufactured using SiC having the high thermal resistance and chemical resistance, thereby allowing the holder to be easily and firmly inserted into grooves of the boat supporting bars and stably maintained therein.

While the invention has been shown and described with respect to the preferred embodiments, it will be understood by those skilled in the art that various changes and modifications may be made without departing from the spirit and scope of the invention as defined in the following claims.

What is claimed is:

1. An apparatus for fabricating a semiconductor device, comprising:
   a reaction chamber;
   a heater disposed outside the reaction chamber;
   one or more holders for mounting thereon a substrate in the reaction chamber; and
   a substrate transferring device for transferring the substrate to the holders,
   wherein the holders are substantially ring shaped with a hollow in the center and a continuous circumference, each of which includes at least two arc-shaped major portions for supporting a circumference of a substrate when the substrate is mounted on the holder, and at least two recessed portions for interconnecting end parts of the major portions, the major portions and the recessed portions being disposed alternately on the circumference of the ring shaped holder,
   wherein each of the recessed portions has a width larger than that of a tweezer plate of the substrate transferring device and has a height difference with the major portions allowing the tweezer plate to be lowered and retracted from each holder after the substrate is mounted on the major portions and to be inserted into each holder and raised such that the substrate is mounted on the tweezer plate, and the substrate is thermally processed by the heater in the reaction chamber while the substrate is mounted on the holder.

2. The apparatus for fabricating a semiconductor device of claim 1, further comprising a boat having a plurality of supporting bars at which the holders are vertically stacked.

3. The apparatus for fabricating a semiconductor device of claim 2, wherein the holders and the supporting bars are made of SiC.

4. The apparatus for fabricating a semiconductor device of claim 2, wherein the holders are stacked on the boat by being inserted into grooves formed in the supporting bars.

5. The apparatus for fabricating a semiconductor device of claim 1, wherein each holder has a plane symmetry with regard to a plane passing through a center point thereof.

6. The apparatus for fabricating a semiconductor device of claim 1, wherein the reaction chamber is arranged in a heat diffusing tube for providing uniform temperature distribution in the reaction chamber, and the heater is disposed outside the heat diffusing tube.

7. A boat for use in an apparatus for fabricating a semiconductor device, comprising:
   a plurality of supporting bars;
   a plurality of grooves formed in the boat supporting bars;
   one or more substantially ring shaped holders with a hollow in the center and a continuous circumference, which are supported by the grooves, each holder including at least two arc-shaped major portions for supporting a circumference of a substrate when the substrate is mounted on the holder, and at least two recessed portions for interconnecting end parts of the major portions, the major portions and the recessed portions being disposed alternately on the circumference of the ring shaped holder,
   wherein each of the recessed portions has a width larger than that of a tweezer plate of a substrate transferring device and has a height difference with the major portions allowing the tweezer plate to be lowered and retracted from each holder after the substrate is mounted on the major portions and to be inserted into each holder and raised such that the substrate is mounted on the tweezer plate, and the substrate is thermally processed by a heater in a reaction chamber while the substrate is mounted on the holder.

8. A holder for use in an apparatus for fabricating a semiconductor device, wherein the holder is ring shaped with a hollow in the center and a continuous circumference and includes at least two arc-shaped major portions for supporting a circumference of a substrate when the substrate is mounted on the holder, and at least two recessed portions for interconnecting end parts of the major portions, the major portions and the recessed portions being disposed alternately on the circumference of the ring shaped holder,
   wherein each of the recessed portions has a width larger than that of a tweezer plate of a substrate transferring device and has a height difference with the major portions allowing the tweezer plate to be lowered and retracted from each holder after the substrate is mounted on the major portions and to be inserted into each holder and raised such that the substrate is mounted on the tweezer plate, and the substrate is thermally processed by the heater in the reaction chamber while the substrate is mounted on the holder.

9. An apparatus for fabricating a semiconductor device, comprising:
   a reaction chamber;
   a heater disposed outside the reaction chamber;
   one or more holders for mounting thereon a substrate in the reaction chamber; and
   a substrate transferring device for transferring the substrate to the holders,
   wherein the holders are substantially ring shaped with a hollow in the center and a continuous circumference, each of which includes at least two arc-shaped major portions for supporting a circumference of a substrate when the substrate is mounted on the holder, and at least two recessed portions for interconnecting end parts of the major portions, the major portions and the recessed portions being disposed alternately on the circumference of the ring shaped holder, wherein each of the recessed portions has a width larger than that of a tweezer plate of the substrate transferring device and has a height difference with the major portions, which is a sum of a distance between a bottom of the substrate and a upper surface of the tweezer, a distance between a bottom of the tweezer and a upper surface of the recessed portions and a thickness of the tweezer, allowing the tweezer plate to be lowered and retracted from each holder after the substrate is mounted on the major portions, and the substrate is thermally processed by the heater in the reaction chamber while the substrate is mounted on the holder.

* * * * *